United States Patent [19]

Inoue et al.

[11] Patent Number: 5,530,721

[45] Date of Patent: Jun. 25, 1996

[54] EQUALIZER AND TERMINAL DEVICE FOR MOBILE COMMUNICATIONS

[75] Inventors: Akira Inoue; Mitsuhiro Suzuki, both of Chiba, Japan

[73] Assignee: Sony Corporation, Tokyo, Japan

[21] Appl. No.: 385,473

[22] Filed: Feb. 8, 1995

[30] Foreign Application Priority Data

Feb. 25, 1994 [JP] Japan .................................. 6-028348

[51] Int. Cl.⁶ .............................. H03H 7/30; H03H 7/40; H03K 5/159
[52] U.S. Cl. ........................... 375/232; 375/233; 375/236
[58] Field of Search ...................................... 375/229, 233, 375/232, 230, 236; 364/724.2; 333/18, 28 R

[56] References Cited

U.S. PATENT DOCUMENTS

| | | | |
|---|---|---|---|
| 5,065,241 | 11/1991 | Iga | 358/166 |
| 5,210,774 | 5/1993 | Abbiate et al. | 375/14 |
| 5,359,628 | 10/1994 | Muto | 375/94 |
| 5,369,668 | 11/1994 | Yamamoto | 375/14 |
| 5,414,571 | 5/1995 | Matsushige et al. | 360/65 |
| 5,420,884 | 5/1995 | Inoue | 375/229 |

*Primary Examiner*—Stephen Chin
*Assistant Examiner*—Don Vo
*Attorney, Agent, or Firm*—Jay H. Maioli

[57] ABSTRACT

An equalizer for use in a receiving system of a code transmission system has a plurality of series-connected delay elements, a plurality of coefficient units for weighting tap output signals extracted in parallel from the delay elements, an adder for adding output signals from the coefficient units, and a tap coefficient setting circuit for adjusting the weighting of the coefficient units. The tap coefficient setting circuit has a multiplier for multiplying a differential signal, the differential signal representing a difference between an output signal from the equalizer and a predetermined reference signal, and the tap output signals, a variation detecting circuit for being supplied with an output signal from the multiplier and detecting a variation of tap coefficients, and an accumulating circuit for outputting established tap coefficients based on an output signal from the variation detecting circuit.

4 Claims, 8 Drawing Sheets

EQUALIZER AND TERMINAL DEVICE FOR MOBILE COMMUNICATIONS

BACKGROUND OF THE INVENTION

The present invention relates to an equalizer and a terminal device for mobile communications, and more particularly to an equalizer having a filter coefficient setting circuit, and a terminal device with such an equalizer for mobile communications.

High-speed code transmission systems such as digital radio telephone systems suffer a delayed dispersion due to multipath propagations, often bringing about fading. As a result, terminal devices for mobile communications have reception characteristics greatly degraded by such fading.

For solving the above problems, it is effective to use an adaptive equalizer which adapts itself to changing transmission path characteristics. To obtain better equalization characteristics when the transmission path has its characteristics changing rapidly, it is important that the adaptive equalizer be capable of sufficiently adapting itself to rapidly changing transmission path characteristics.

FIG. 1 of the accompanying drawings shows a receiving system having an equalizer in a terminal device for a mobile communications system such as a digital radio telephone system.

As shown in FIG. 1, the receiving system comprises an antenna 301, a local oscillator A 302, a frequency converter 303, a bandpass filter 304, a local oscillator B 305, a frequency converter 306, a correlator 307, a synchronizing circuit 308, an A/D converter 309, an equalizer 310, and an output terminal 311.

An RF signal (a) received by the antenna 301, which represents a transmitted signal that has been modulated by π/4-shift DQPSK is supplied to an input terminal of the frequency converter 303. The frequency converter 303 converts the frequency of the RF signal (a) into an IF (intermediate frequency) signal (b) using a signal that is supplied from the local oscillator A 302 to another input terminal of the frequency converter 303.

The frequency converter 303 outputs an IF signal to the bandpass filter 304, which removes noise from the signal band to produce an band-limited IF signal (c).

The IF signal (c) is supplied to an input terminal of the frequency converter 306. The frequency converter 306 converts the frequency of the IF signal (c) into a baseband signal (d) using a signal that is supplied from the local oscillator B 305 to another input terminal of the frequency converter 306.

The baseband signal (d) output from the frequency converter 306 is supplied to the correlator 307 and the A/D converter 309.

The correlator 307, which serves to remove effects of fading from the baseband signal (d), supplies its output signal to the synchronizing circuit 308. The synchronizing circuit 308 generates a sample timing signal (e) and supplies the sample timing signal (e) to the A/D converter 309.

Based on the supplied sample timing signal (e), the A/D converter 309 samples the baseband signal (d) supplied from the frequency converter 306 and converts the sampled baseband signal (d) into a digital signal. The digital signal from the A/D converter 309 is supplied to the equalizer 310.

Prior to describing details of the equalizer 310, the signal receiving operation of the receiving system shown in FIG. 1 which has a bearing on the present invention will briefly be described below.

A signal transmitted over a transmission path is a signal including a training signal composed of known symbols as shown in FIG. 2 of the accompanying drawings. In the receiving system, the training signal is detected on the basis of the known symbols, and tap coefficients of the equalizer 310 are converged and established on the basis of the detected training signal. After the training signal, the equalizer 310 updates the tap coefficients that have been converged upon training, thereby to adapt itself to changing transmission path characteristics.

The equalizer 310 will now be described in detail with respect to its arrangement and operation. FIG. 3 of the accompanying drawings shows, by way of example, of details of a linear equalizer (LE).

As shown in FIG. 3, the equalizer, generally denoted by 500, has a signal input terminal 501, a transversal filter 502, a symbol determining circuit 503, a signal output terminal 504, a subtractor 505, and a tap coefficient setting circuit 506.

The transversal filter 502 comprises a plurality of series-connected delay elements $T_1 \sim T_{n-1}$, a plurality of tap lines $t_0 \sim t_{n-1}$ extending respectively from the delay elements $T_1 \sim T_{n-1}$, a plurality of coefficient units $h_0 \sim h_{n-1}$, and a plurality of adders $a_0 \sim a_{n-1}$.

A series digital signal (f) supplied to the signal input terminal 501 is delayed successively by the (n−1) delay elements $T_1 \sim T_{n-1}$, and extracted in parallel from the n tap lines $t_0 \sim t_{n-1}$ which extend from the input and output terminals of the delay elements $T_1 \sim T_{n-1}$. The signals from the tap lines $t_0 \sim t_{n-1}$ are weighted by the corresponding coefficient units $h_0 \sim h_{n-1}$, and added by the adders $a_0 \sim a_{n-1}$ into a single line that is supplied to the symbol determining circuit 503.

Since symbols are shifted from normal phase points of π/4-shift DQPSK in the transversal filter 502 due to fading, the symbol determining circuit 503 determines the symbols of an output signal from the transversal filter 502, and outputs symbols corresponding to the respective normal phase points of π/4-shift DQPSK.

The subtractor 505 calculates the difference between an output signal (q) from the transversal filter 502 and an output signal (i) from the symbol determining circuit 503, and applies a differential signal (j) to the tap coefficient setting circuit 506. Based on the differential signal (j) from the subtractor 505, the tap coefficient setting circuit 506 estimates tap coefficients and generates control signals $e_0 \sim e_{n-1}$ for establishing the estimated tap coefficients. The control signals $e_0 \sim e_{n-1}$ from the tap coefficient setting circuit 506 are supplied to the corresponding coefficient units to establish and update the coefficients therein.

Details of the coefficient setting circuit 506 will be described later on. Another equalizer will be described below with reference to FIG. 4 of the accompanying drawings. The equalizer shown in FIG. 4 is known as a decision-feedback equalizer (DFE).

The equalizer, generally denoted by 600 in FIG. 4, is substantially similar to the equalizer shown in FIG. 3, and has a transversal filter 602, a symbol determining circuit 603, a subtractor 605, and a tap coefficient setting circuit 606. The tap coefficient setting circuit 606 operates in the same manner as the tap coefficient setting circuit 506.

The equalizer 600 shown in FIG. 4 differs from the equalizer 500 shown in FIG. 3 with respect to the arrangement of the transversal filter 602. The transversal filter 602 shown in FIG. 4 comprises a section for being supplied with input signals and a section for being supplied with an output signal from the symbol determining circuit 603.

The section for being supplied with an input signal comprises a plurality of delay elements $T_1 \sim T_{m-1}$ for delaying an input signal supplied from a signal input terminal 601, a plurality of tap lines $t_0 \sim t_{m-1}$ extending respectively from the delay elements $T_1 \sim T_{m-1}$, a plurality of coefficient units $h_0 \sim h_{m-1}$ for multiplying tap output signals by respective coefficients, and a plurality of adders $a_1 \sim a_{m-1}$ for adding all weighted tap output signals.

The section for being supplied with an output signal from the symbol determining circuit 603 comprises a plurality of delay elements $T_m \sim T_{m+k-1}$ for delaying an output signal from the symbol determining circuit 603, a plurality of tap lines $t_m \sim t_{m+k-1}$ extending respectively from the delay elements $T_m \sim T_{m+k-1}$, a plurality of coefficient units $h_m \sim h_{m+k-1}$ for multiplying tap output signals by respective coefficients, and a plurality of adders $a_m \sim a_{m+k-1}$ for adding all weighted tap output signals and adding the sum to the tap output signals from the adders $a_1 \sim a_{m-1}$.

FIG. 5 of the accompanying drawings shows still another equalizer.

The equalizer, generally denoted by 700 in FIG. 5, comprises a signal input terminal 701, a transversal filter 702, a series estimating circuit 703, a signal output terminal 704, a subtractor 705, and a tap coefficient setting circuit 706.

An output signal from the series estimating circuit 703 is supplied to an input terminal of the transversal filter 702, and successively delayed by delay elements $T_1 \sim T_{n-1}$. The delayed signals are extracted as parallel tap output signals from the delay elements $T_1 \sim T_{n-1}$, and multiplied by coefficients by corresponding tap coefficient units $h_0 \sim h_{n-1}$. The weighted tap output signals from the tap coefficient units $h_0 \sim h_{n-1}$ are added into a signal (l) which is output from the transversal filter 702.

The output signal (l) from the transversal filter 702 is applied to the subtractor 705, which calculates the difference between the output signal (l) and a received signal input to the signal input terminal 701. The subtractor 705 then supplies a differential signal (m) to the series estimating circuit 703.

The differential signal (m) from the subtractor 705 is also supplied to the tap coefficient setting circuit 706. Based on the differential signal (m) from the subtractor 705 and the tap output signals from the transversal filter 702, the tap coefficient setting circuit 706 estimates tap coefficients for the tap coefficient units $h_0 \sim h_{n-1}$, generates control signals to establish tap coefficients for the tap coefficient units $h_0 \sim h_{n-1}$, and supplies the control signals to the tap coefficient units $h_0 \sim h_{n-1}$ to establish tap coefficients therein.

The equalizers incorporating three respective transversal filters have been described above with reference to FIGS. 3, 4, and 5. Either one of these equalizers is arranged to update next tap coefficients based on differential signals between a tap input signal and a differential signal between a convolutional sum of tap coefficients and a reference signal.

The equalizers shown in FIGS. 3, 4, and 5 differ from each other depending on what the tap input signal, the reference signal, and the tap coefficients correspond to. Table 1 below shows details of these equalizers to which the tap input signal, the reference signal, and the tap coefficients correspond.

TABLE 1

|  | Tap input signal | Reference signal | Tap coefficients |
|---|---|---|---|
| Linear equalizer (LE) | Received signal | Transmitted symbols | Inverse transmission path characteristics |
| Decision-feedback equalizer (DFE) | * Received signal * Transmitted symbols | Transmitted symbols | * Inverse transmission path characteristics * Transmission path characteristics |
| Equalizer with series estimation | Transmitted symbols | Received signal | Transmission path characteristics |

The tap coefficient setting circuit in each of the above equalizers will be described below.

As shown in FIG. 6 of the accompanying drawings, the tap coefficient setting circuit is supplied with a tap input signal and a differential signal (representing the difference between a reference signal and an output signal from a transversal filter), and outputs tap coefficients.

FIG. 6 shows only one tap input terminal and only one output terminal for outputting an established tap coefficient. Actually, as shown in FIGS. 3, 4, and 5, there are as many tap input terminals and as many output terminals as the number of coefficient units.

As shown in FIG. 6, the tap coefficient setting circuit has a first input terminal 801 as a tap input terminal, a second input terminal 802, a multiplier 803, an amplifier 804, an accumulating circuit 805, and an output terminal 808. The first input terminal 801 is connected to a tap line extending from each of the series-connected delay elements of the transversal filter. The second input terminal 802 is supplied with a differential signal which represents either the difference between an output signal from a symbol determining circuit and an output signal from the transversal filter, or the difference between an input signal of the equalizer and an output signal from the transversal filter, or the difference between a reference signal and an output signal from the transversal filter.

The multiplier 803 multiplies the tap input signal supplied from the first input terminal 801 by the differential signal supplied from the second input terminal 802. The amplifier 804 amplifies an output signal from the multiplier 803 with an amplification factor of $\mu_1$. The accumulating circuit 805 accumulates signals supplied from the amplifier 804 in each $Z^{-1}$ ($Z = e^{i\omega T}$, identical to the delay time of each delay element of the transversal filter). The output terminal 808 is connected to each of the control terminals of the coefficient units of the transversal filter.

The accumulating circuit 805 comprises an adder 806 and a delay circuit 807. The delay circuit 807 delays an output signal from the adder 806 for a period of time which is the same as the delay time of each delay element of the transversal filter. The accumulating circuit 805 serves to add a discrete signal inputted with a delay time equal to the sampling period to an accumulated value of signals that have been input prior to the discrete signal.

Operation of the equalizer and the tap coefficient setting circuit described above will briefly be described below.

If it is assumed in FIG. 3 that the transversal filter 502 has an order N, an input signal $x_j$ at a time $jT$ ($j = 0, 1, 2, \ldots$, N; T represents a sampling period), and a weighting coefficient $a_{i,j}$ (i=0, 1, 2, ..., N), then the transversal filter 502 produces an output signal $y_j$ expressed by:

$$y_j = \sum_{i=0}^{N} a_{i,j} x_{j-1}.$$

If a weighting coefficient vector $A_j$ and an input signal vector $X_j$ are represented respectively by:

$$A_j = [a_{0,j}, a_{1,j}, \ldots, a_{A,j}]^T;$$

$$X_j = [x_j, x_{j-1}, \ldots, a_{j-N}]^T;$$

then the output signal from the transversal filter 502 can be expressed by:

$$Y_j = A_j^T X_j = X_j^T Z_j.$$

If a target signal value (reference signal or the output signal from the symbol determining circuit 503 in FIG. 3) at this time is represented by $d_j$, then the differential signal output from the subtractor 505 is given by $\epsilon_j = d_j - y_j = d_j - A_j^T X_j$. The differential signal $\epsilon_j$ is supplied to the second input terminal 802 shown in FIG. 6, whereas the input signal vector $X_j$ is supplied to the first input signal 801. The input signal vector $X_j$ supplied to the first input signal 801 and the differential signal $\epsilon_j$ supplied to the second input terminal 802 are multiplied by the multiplier 803, and the sum signal is then amplified $\mu_1$ times by the amplifier 804, which produces an output signal $\mu_1 \epsilon_j X_j$.

The output signal $\mu_1 \epsilon_j X_j$ from the amplifier 804 is added by the adder 806 to a prior tap coefficient. Therefore, a newly established tap coefficient is given as $A_{j+1} = A_j + \mu_1 \epsilon_j X_j$.

The tap coefficient thus established is supplied to the control terminal of the corresponding coefficient unit of the transversal filter. As a result, the weighting by the coefficient unit is varied to optimize the filter characteristics of the transversal filter.

Each of the above equalizers is roughly divided into a transversal filter section and a control section. The transversal filter section is composed of delay elements $T_1 \sim T_{n-1}$ for holding an identifying time and a train of successive pulses across the identifying time, weighting circuits (coefficient units $h_0 \sim h_{n-1}$) connected to the delay elements $T_1 \sim T_{n-1}$, and adders $a_1 \sim a_{n-1}$ for combining output signals from the weighting circuits. When each of these equalizers is used in a receiving system of a transmission system for transmitting a signal that has been modulated by π/4-shift DQPSK, the weighting coefficients thereof are established to minimize an intersymbol interference produced at an identifying time due to fading.

Specifically, the tap weighting quantities of a transversal filter are set to an optimum value according to a training signal. The magnitude of tap coefficients are established by a tap coefficient setting circuit as shown in FIG. 6, based on a signal representative of an accumulation at a sampling period of products of signals applied to the taps of the delay elements, and differential signals between a reference signal and an output signal from the transversal filter.

Therefore, the above equalizers are slow in response and hence tend to be unable to adapt themselves to rapidly changing transmission path characteristics.

SUMMARY OF THE INVENTION

It is therefore an object of the present invention to provide an equalizer which resolves the above-mentioned problems.

It is another object of the present invention to provide a terminal device for mobile communications which resolves the above-mentioned problems.

According to the present invention, there is provided an equalizer for use in a receiving system of a code transmission system, comprising a plurality of series-connected delay elements, a plurality of coefficient units for weighting tap output signals extracted in parallel from the delay elements, an adder for adding output signals from said coefficient units, and a tap coefficient setting circuit for adjusting the weighting of said coefficient units, said tap coefficient setting circuit having a multiplier for multiplying a differential signal, the differential signal representing a difference between an output signal from the equalizer and a predetermined reference signal, and the tap output signals, a variation detecting circuit for being supplied with an output signal from said multiplier and detecting a variation of tap coefficients, and an accumulating circuit for outputting established tap coefficients based on an output signal from said variation detecting circuit.

According to the present invention, there is also provided a terminal device for mobile communications, comprising first frequency converting means for frequency-converting a received signal into an intermediate-frequency signal, second frequency converting means for frequency-converting said intermediate-frequency signal into a baseband signal, timing signal generating means for generating a timing signal based on the baseband signal from said second frequency converting means, signal converting means for converting the baseband signal from said second frequency converting means into a digital signal based on the timing signal from said timing signal generating means, and equalizing means for being supplied with the digital signal from said signal converting means, said equalizing means having a transversal filter and a filter coefficient setting circuit for generating a filter coefficient setting signal to establish filter coefficients for said transversal filter by detecting variations between present and past signals and accumulating the detected variations.

According to the present invention, there is also provided an equalizer comprising a transversal filter and a filter coefficient setting circuit for generating a filter coefficient setting signal to establish filter coefficients for said transversal filter by detecting variations between present and past signals and accumulating the detected variations.

Since the filter coefficient setting circuit of the equalizer has a circuit for detecting a variation of filter coefficients, the equalizer can well adapt itself to rapidly changing transmission path characteristics. When the equalizer is incorporated in a receiving system of a high-speed code transmission system, the ability of the receiving system to adapt itself to changing transmission path characteristics is improved, making it possible to estimate a transmission path with high accuracy.

DETAILED DESCRIPTION OF THE PREFERRED EMBODIMENT

Figure 7:
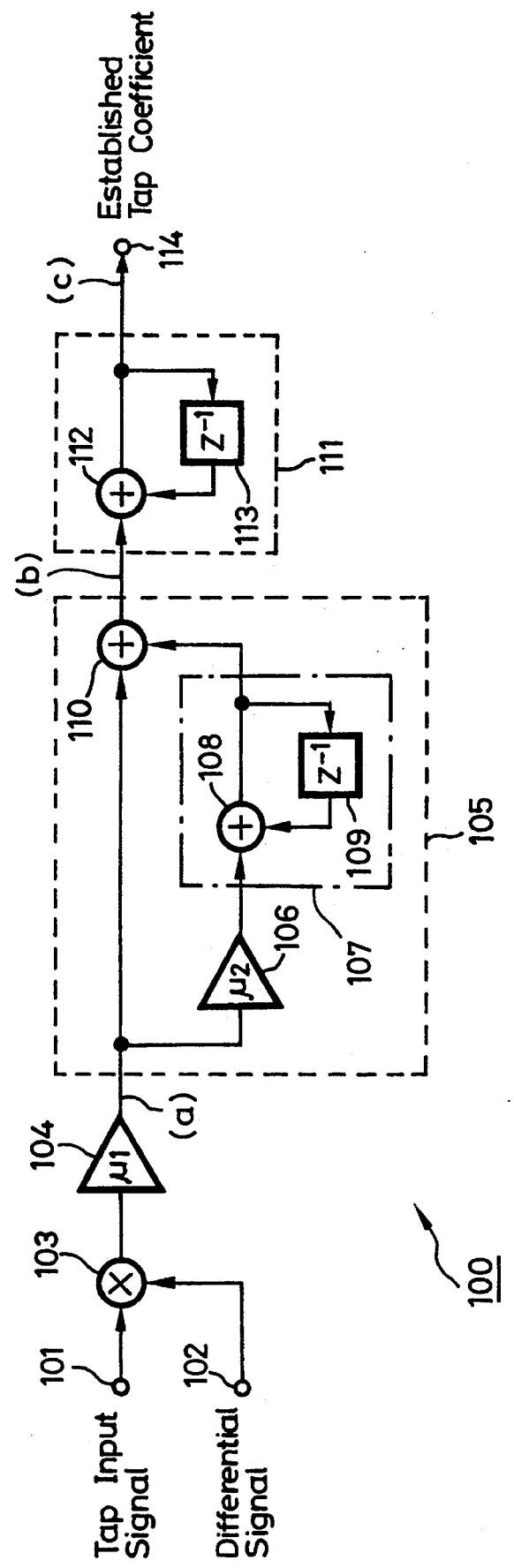
FIG. 7 is a block diagram of a tap coefficient establishing circuit of an equalizer according to the present invention.

FIG. 7 shows in block form a tap coefficient establishing circuit 100 of an equalizer according to the present invention. Other portions of the equalizer, e.g., a transversal filter, may be identical to those of the equalizers shown in FIGS. 3, 4, and 5, and hence those shown in FIGS. 3, 4, and 5 will be referred to, when necessary, in connection with the tap coefficient establishing circuit 100.

As shown in FIG. 7, the tap coefficient establishing circuit 100 has a first input terminal 101 which is supplied with one of tap signals extracted from the series-connected delay elements of the transversal filter of the equalizer.

The tap coefficient establishing circuit 100 also has a second input terminal 102 which is supplied with a differential signal indicative of the difference between an output signal from the transversal filter and a reference signal such as an output signal from the symbol determining circuit, for example.

The tap coefficient establishing circuit 100 includes a multiplier 103 for multiplying the tap signal supplied to the first input terminal 101 from the transversal filter and the differential signal supplied to the second input terminal 102, and an amplifier 104 for amplifying an output signal, representative of the product, from the multiplier 103 with an amplification factor of $\mu_1$. The tap coefficient establishing circuit 100 also has a variation detecting circuit 105 for detecting a variation of a tap coefficient.

The variation detecting circuit 105 includes an amplifier 106 for amplifying an output signal from the amplifier 104 with an amplification factor of $\mu_2$, and a first accumulating circuit 107 for adding a new input signal to an accumulated value of past signals. The first accumulating circuit 107 is composed of an adder 108 and a delay element 109.

The variation detecting circuit 105 also includes an adder 110 for adding the output signal from the amplifier 104 and an output signal from the first accumulating circuit 107.

The tap coefficient establishing circuit 100 also has a second accumulating circuit 111 composed of an adder 112 and a delay element 113 and connected to an output terminal 114:. The delay elements 109, 113 of the first and second accumulating circuits 107, 111 delay the signal for the same period of time as the delay elements of the transversal filter. The first and second accumulating circuits 107, 111 add a discrete signal supplied with a delay time equal to the sampling period to an accumulated value of signals that have been input prior to the discrete signal.

Figure 6:
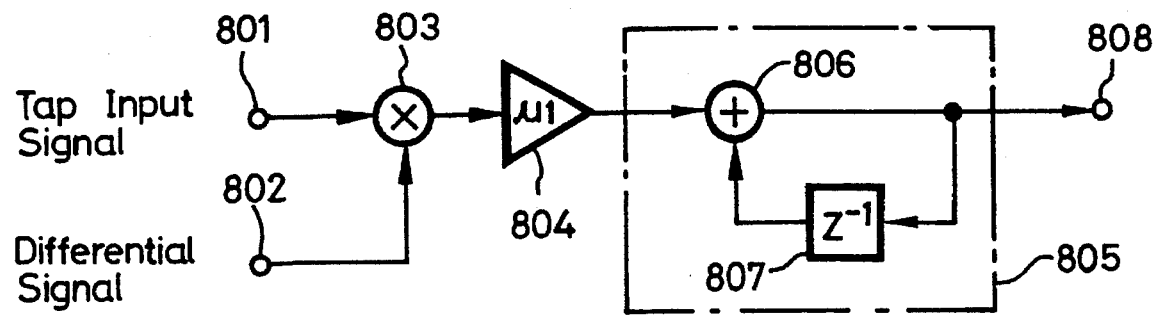
FIG. 6 is a block diagram of a tap coefficient establishing circuit.

The tap coefficient establishing circuit 100 shown in FIG. 7 does not differ from the tap coefficient establishing circuit shown in FIG. 6 except for the variation detecting circuit 105. Therefore, only the variation detecting circuit 105 will be described below, and the other details of the tap coefficient establishing circuit 100 shown in FIG. 7 are identical to those of the tap coefficient establishing circuit shown in FIG. 6 and will not be described below.

The amplifier 104 outputs a signal (a) which represents the product of the tap input signal prior to the time jT and the differential signal, which produce has been amplified $\mu_1$ times. The output signal from the amplifier 104 is amplified $\mu_2$ times by the amplifier 106, and accumulated by the first accumulating circuit 107. The first accumulating circuit 107 outputs an accumulated value of signals prior to the time jT. The accumulated value from the first accumulating circuit 107 and the output signal from the amplifier 104 are added to each other by the adder 110. The adder 110 outputs a sum signal representing the difference between the present and past signals, i.e., a variation (b) therebetween. The output signal from the adder 110 is supplied to the second accumulating circuit 111. The second accumulating circuit 111 outputs an established tap coefficient as corrected by the variation (b) from the variation detecting circuit 105, as a next established tap coefficient (c), which is output from the output terminal 114.

Since the tap coefficient establishing circuit 100 according to the present invention has the variation detecting circuit 105 for detecting a variation of a tap coefficient, it can well adapt itself to rapidly changing transmission path characteristics.

Figure 1:
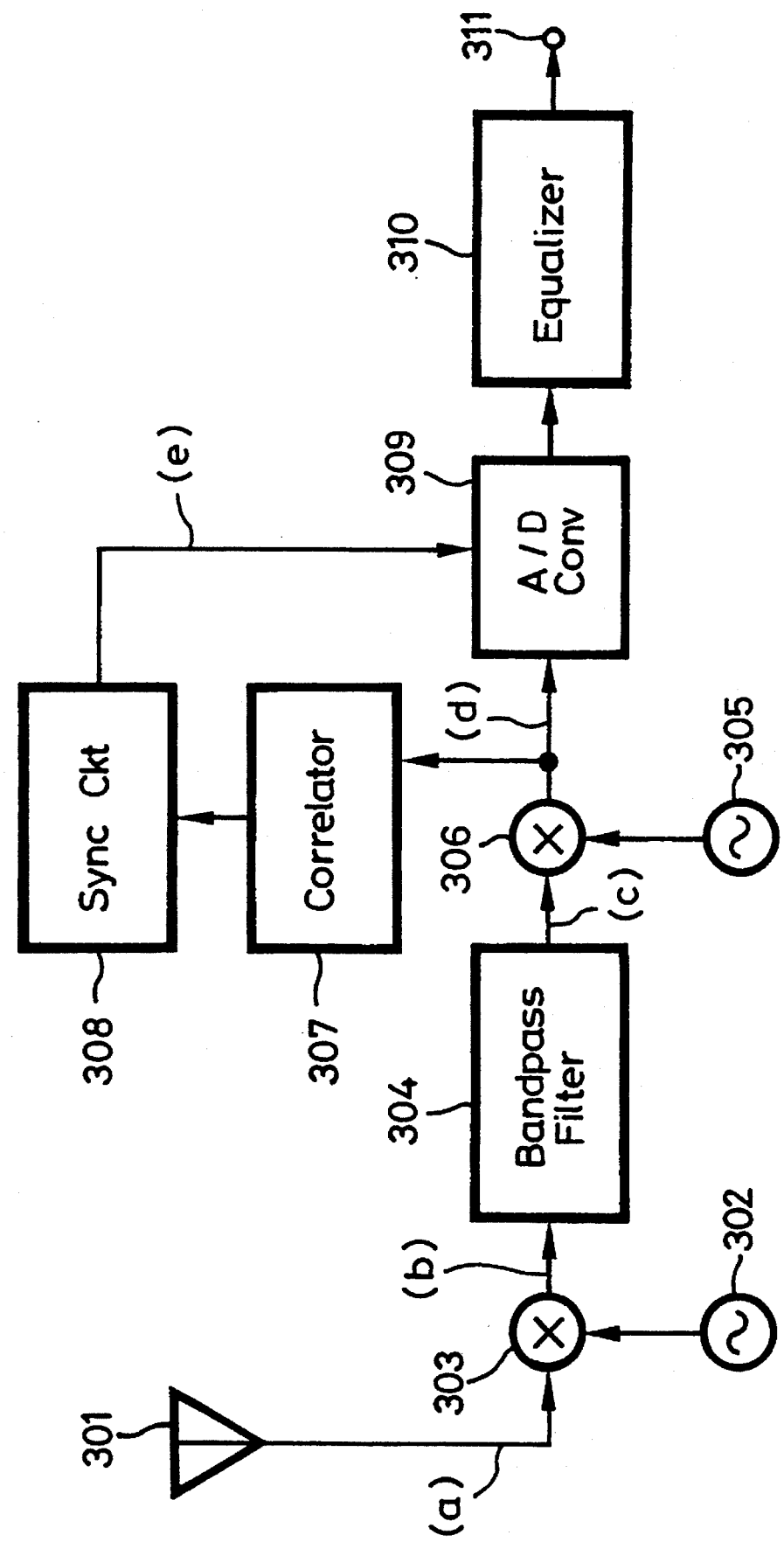
FIG. 1 is a block diagram of a receiving system having an equalizer in a terminal device for a mobile communications system.
Figure 2:
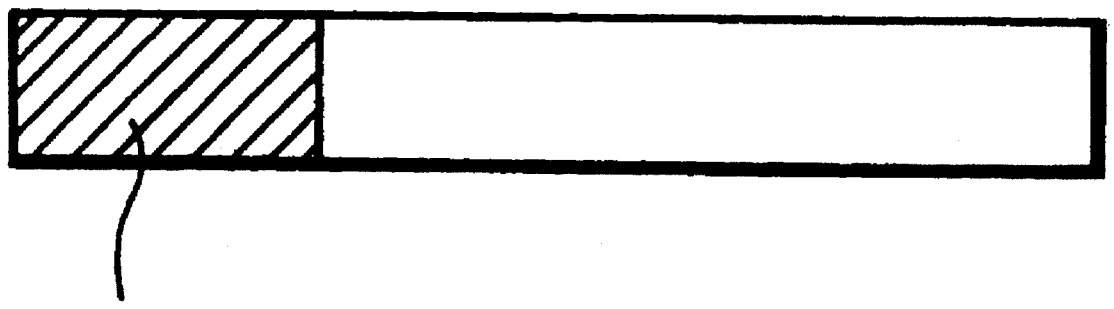
FIG. 2 is a diagram showing a signal burst in mobile communications.
Figure 3:
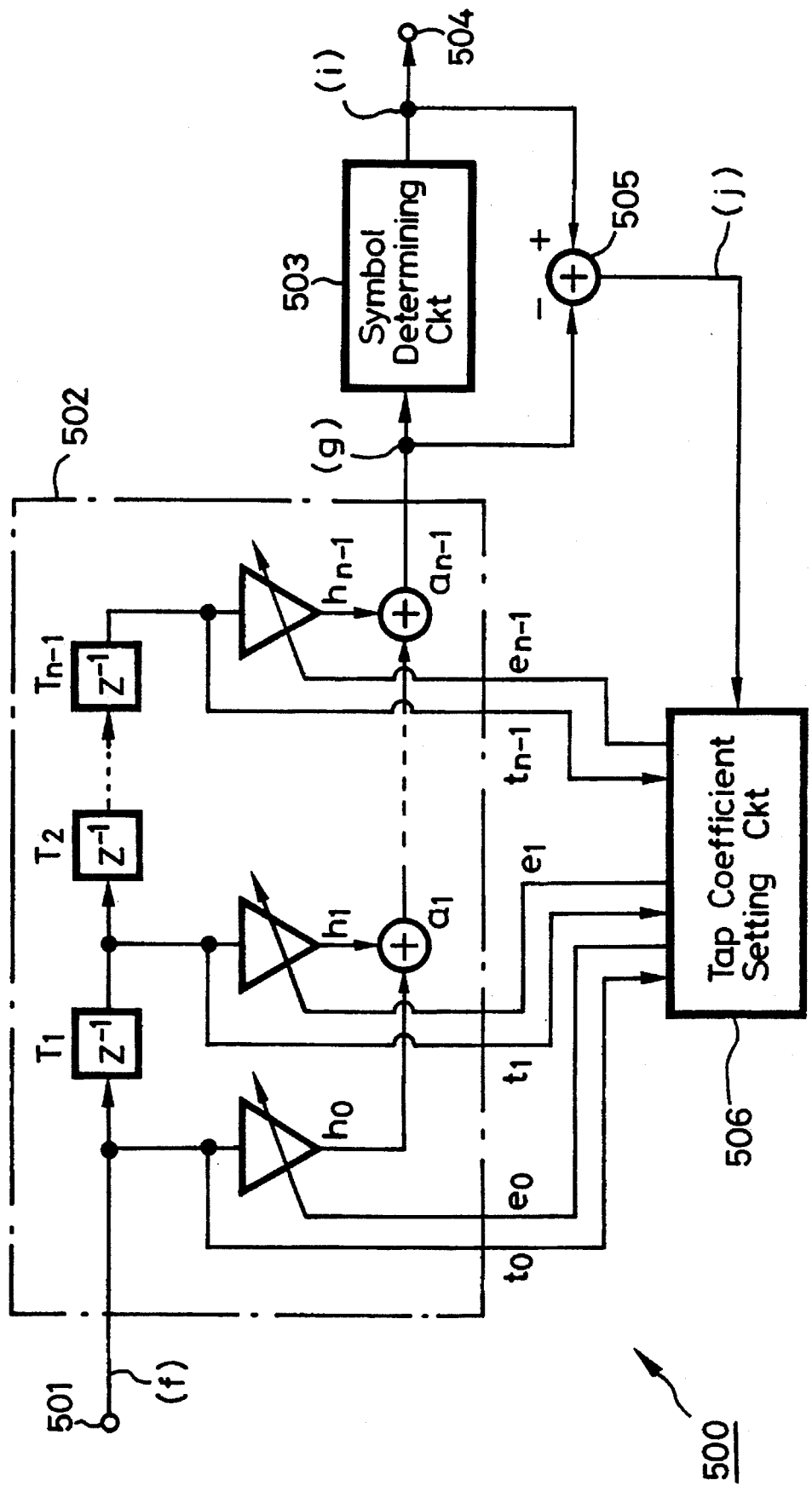
FIG. 3 is a block diagram of an equalizer.
Figure 4:
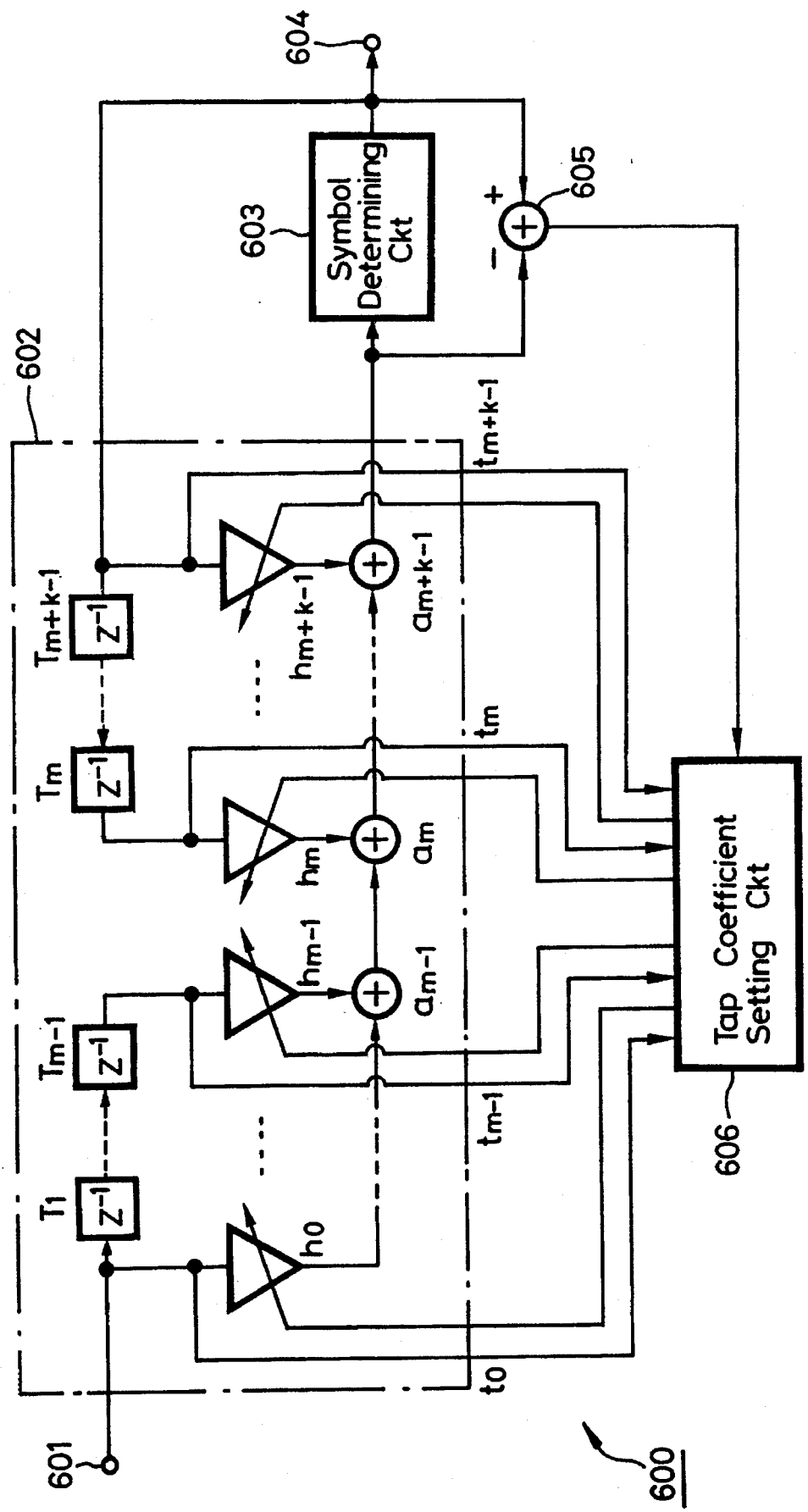
FIG. 4 is a block diagram of another equalizer.
Figure 5:
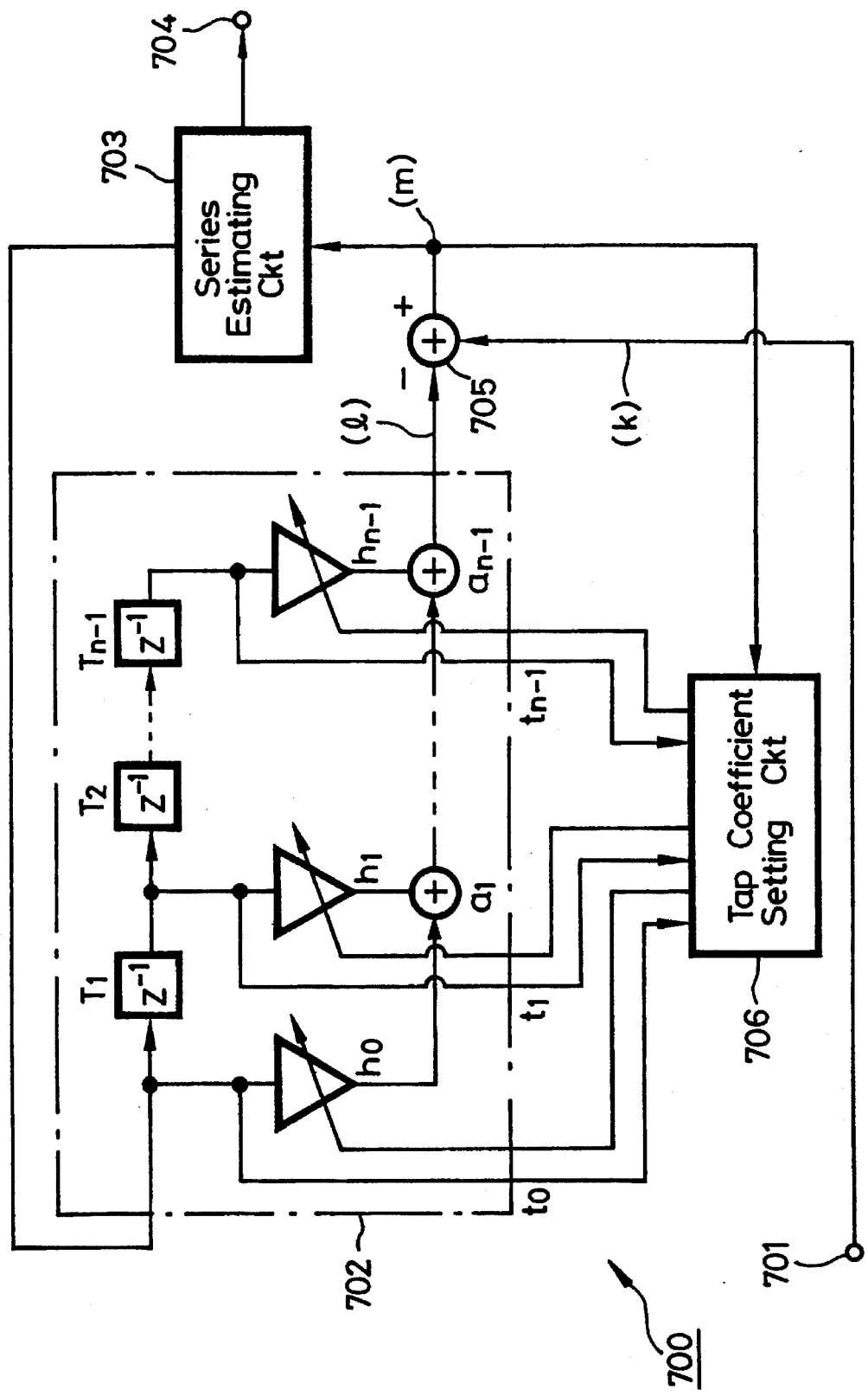
FIG. 5 is a block diagram of still another equalizer.

The tap coefficient establishing circuit 100 according to the present invention can be incorporated in either one of the equalizers shown in FIGS. 3, 4, or 5.

Figure 8:
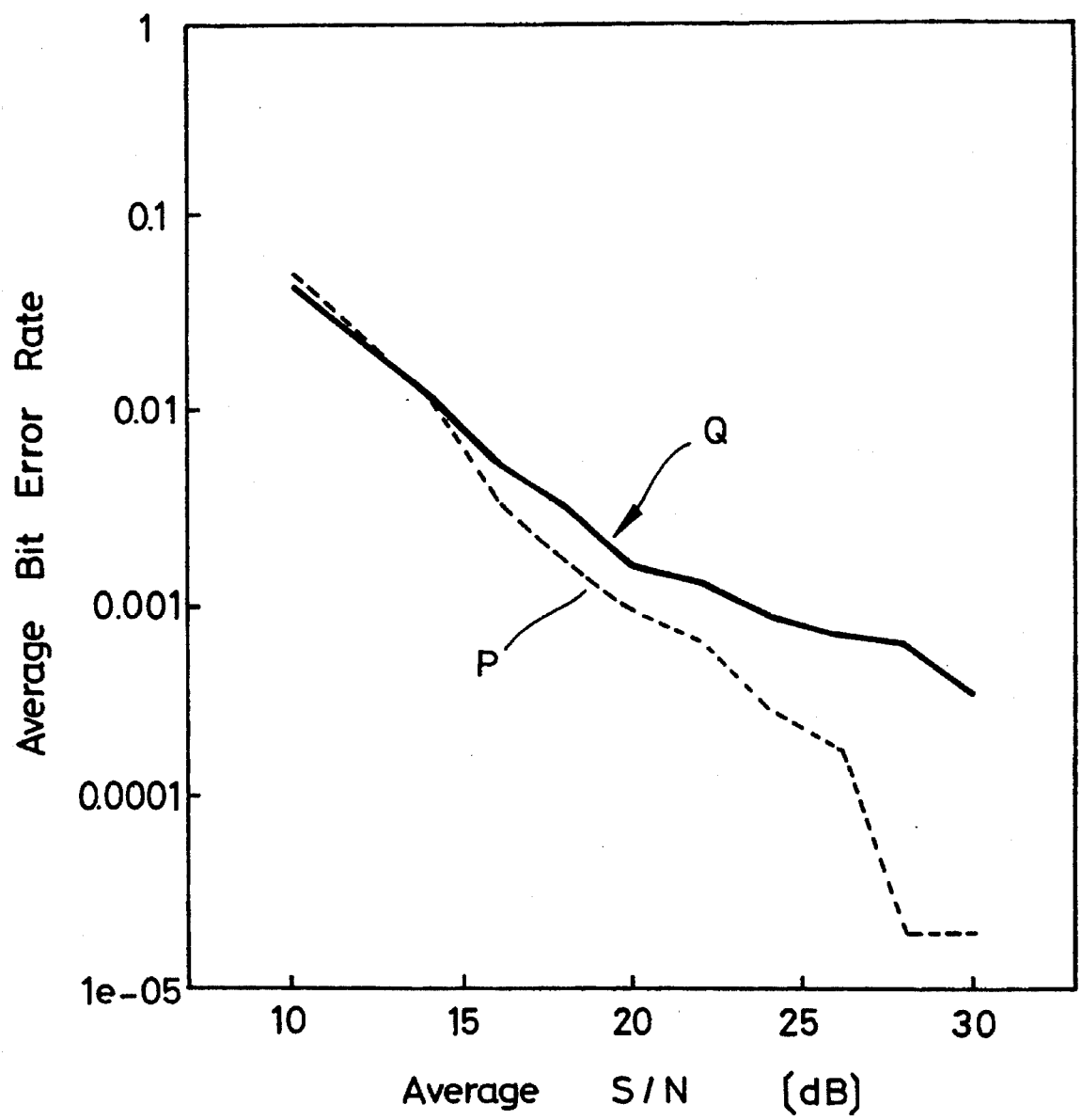
FIG. 8 is a diagram showing, for comparison, equalizing characteristics of an equalizer which incorporates the tap coefficient establishing circuit shown in FIG. 6 and an equalizer which incorporates the tap coefficient establishing circuit according to the present invention.

FIG. 8 shows equalizing characteristics P of the equalizer shown in FIG. 5 which incorporates the tap coefficient establishing circuit 100 according to the present invention, and equalizing characteristics Q of an equalizer which incorporates the tap coefficient establishing circuit shown in FIG. 6.

The equalizing characteristics P, Q shown in FIG. 8 are average S/N vs. average error rate characteristics which were obtained when the transmission path model comprised a 2-wave 1-symbol delay Rayleigh fading model with a maximum Doppler frequency of 80 Hz.

As shown in FIG. 8, the equalizer which incorporates the tap coefficient establishing circuit 100 according to the present invention has a smaller average bit error rate than the equalizer which incorporates the tap coefficient establishing circuit shown in FIG. 6.

The principles of the present invention are also applicable to equalizers for use in terminal devices for mobile communications for receiving signals modulated by other processes than the π/4-shift DQPSK process.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. An equalizer for use in a receiving system of a code transmission system, comprising:

a plurality of series-connected delay elements;

a plurality of coefficient units for weighting tap output signals extracted in parallel from the delay elements;

an adder for adding output signals from said coefficient units; and a tap coefficient setting circuit for adjusting weighting coefficients of said plurality of coefficient units, said tap coefficient setting circuit having a multiplier for multiplying the tap output signals by a differential signal representing a difference between an output signal from the equalizer and a predetermined reference signal, a variation detecting circuit supplied with an output signal from said multiplier and detecting a variation of tap coefficients, and an established tap coefficient accumulating circuit for outputting established tap coefficients based on an output signal from said variation detecting circuit, wherein said variation detecting circuit comprises a discrete time signal accumulating circuit for accumulating discrete time signals supplied to an input terminal of said variation detecting circuit, and an adder for adding an output signal from said discrete time signal accumulating circuit and said discrete time signals.

2. A terminal device for mobile communications, comprising:

first frequency converting means for frequency-converting a received signal into an intermediate-frequency signal;

second frequency converting means for frequency-converting said intermediate-frequency signal into a baseband signal;

timing signal generating means for generating a timing signal based on the baseband signal from said second frequency converting means;

signal converting means for converting the baseband signal from said second frequency converting means into a digital signal based on the timing signal from said timing signal generating means; and equalizing means supplied with the digital signal from said signal converting means, said equalizing means having a transversal filter and a filter coefficient setting circuit for generating a filter coefficient setting signal to establish filter coefficients for said transversal filter, wherein the filter coefficient setting circuit comprises: a variation detector for detecting variations between present and past signals and an accumulator for accumulating the detected variations as output signals from said variation detector to obtain the filter coefficient setting signal, said variation detector comprising a discrete time signal accumulating circuit for accumulating discrete time signals supplied to an input terminal of said variation detecting circuit and an adder for adding an output signal from said discrete time signal accumulating circuit and said discrete time signals.

3. The terminal device according to claim 2, wherein said equalizing means further comprises a symbol determining circuit for determining an output signal from said transversal filter and symbols thereof, and a subtractor for calculating a difference between an output signal from said symbol determining circuit and the output signal from said transversal filter, said filter coefficient setting circuit being supplied with an output signal from said subtractor.

4. An equalizer comprising:

a transversal filter; and a filter coefficient setting circuit for generating a filter coefficient setting signal to establish filter coefficients for said transversal filter, wherein the filter coefficient setting circuit comprises: a variation detector for detecting variations between present and past signals and an accumulator for accumulating the detected variations as output signals from said variation detector to obtain the filter coefficient setting signal, said variation detector comprising a discrete time signal accumulating circuit for accumulating discrete time signals supplied to an input terminal of said variation detecting circuit and an adder for adding an output signal from said discrete time signal accumulating circuit and said discrete time signals.

* * * * *